United States Patent
Yeh et al.

(10) Patent No.: US 7,696,801 B2
(45) Date of Patent: Apr. 13, 2010

(54) RESET METHOD FOR CLOCK TRIGGERING DIGITAL CIRCUIT AND RELATED SIGNAL GENERATING APPARATUS UTILIZING THE RESET METHOD

(75) Inventors: Sung-Hung Yeh, Taipei Hsien (TW); Kuo-Uei Yang, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/755,001

(22) Filed: May 30, 2007

(65) Prior Publication Data

US 2007/0290732 A1 Dec. 20, 2007

(30) Foreign Application Priority Data

Jun. 16, 2006 (TW) .............................. 95121577 A (51) Int. Cl.
*H03K 3/02* (2006.01)
(52) U.S. Cl. ....................... 327/198; 327/142
(58) Field of Classification Search ................. 327/198, 327/142
See application file for complete search history.

(56) References Cited

U.S. PATENT DOCUMENTS

| | | | | |
|---|---|---|---|---|
| 3,979,732 A | * | 9/1976 | Hepworth et al. ........... | 710/108 |
| 4,641,044 A | * | 2/1987 | Shiraishi ..................... | 327/142 |
| 5,303,350 A | * | 4/1994 | Yu et al. ..................... | 713/600 |
| 5,323,066 A | * | 6/1994 | Feddeler et al. ............ | 327/142 |
| 5,359,636 A | * | 10/1994 | Aoyama ..................... | 377/73 |
| 6,307,480 B1 | | 10/2001 | Sheldon et al. | |
| 6,762,631 B1 | * | 7/2004 | Kumar ....................... | 327/142 |
| 6,864,735 B2 | | 3/2005 | Joo | |
| 2003/0160644 A1 | | 8/2003 | Ling | |
| 2004/0113675 A1 | | 6/2004 | Joo | |
| 2005/0253638 A1 | * | 11/2005 | Dietrich et al. ............. | 327/198 |
| 2009/0079476 A1 | * | 3/2009 | Sakai et al. ................. | 327/142 |

FOREIGN PATENT DOCUMENTS

| | | |
|---|---|---|
| JP | 2006163531 | 6/2006 |
| TW | 200303651 | 9/2003 |

OTHER PUBLICATIONS

English language translation of abstract of JP 2006163531 (published Jun. 22, 2006).

* cited by examiner

*Primary Examiner*—Lincoln Donovan
*Assistant Examiner*—William Hernandez
(74) *Attorney, Agent, or Firm*—Thomas, Kayden, Horstemeyer & Risley (57) ABSTRACT

The present invention discloses a reset method for a digital circuit. The method includes: providing a clock signal to the digital circuit; keeping the clock signal at a logic level according to a first indicating signal; generating a reset signal for resetting the digital circuit; and recovering the clock signal to the digital circuit according to a second indicating signal.

16 Claims, 7 Drawing Sheets

RESET METHOD FOR CLOCK TRIGGERING DIGITAL CIRCUIT AND RELATED SIGNAL GENERATING APPARATUS UTILIZING THE RESET METHOD

BACKGROUND OF THE INVENTION

1. Field of the Invention

The present invention relates to a reset method, and more particularly, to a reset method for a digital circuit and related signal generating apparatus.

2. Description of the Prior Art

A flip-flop is a widely used logic circuit device in a digital system, used for storing input data according to rising edge or falling edge of an input clock signal to achieve the objective of synchronizing the whole digital system. Taking a Delay-type Flip-Flop (DFF) as an example, there are two signals, a synchronous signal and an asynchronous signal, used to control the DFF. The synchronous signal is a clock signal, and the asynchronous signal is a preset signal or a reset signal (also referred to as a clear signal). Regardless of other input signals, the output of the flip-flop is maintained at a binary value "1" if the flip-flop is at the preset state, and the output of the flip-flop is set to another logic value "0" if the flip-flop is at the reset state.

Figure 1:
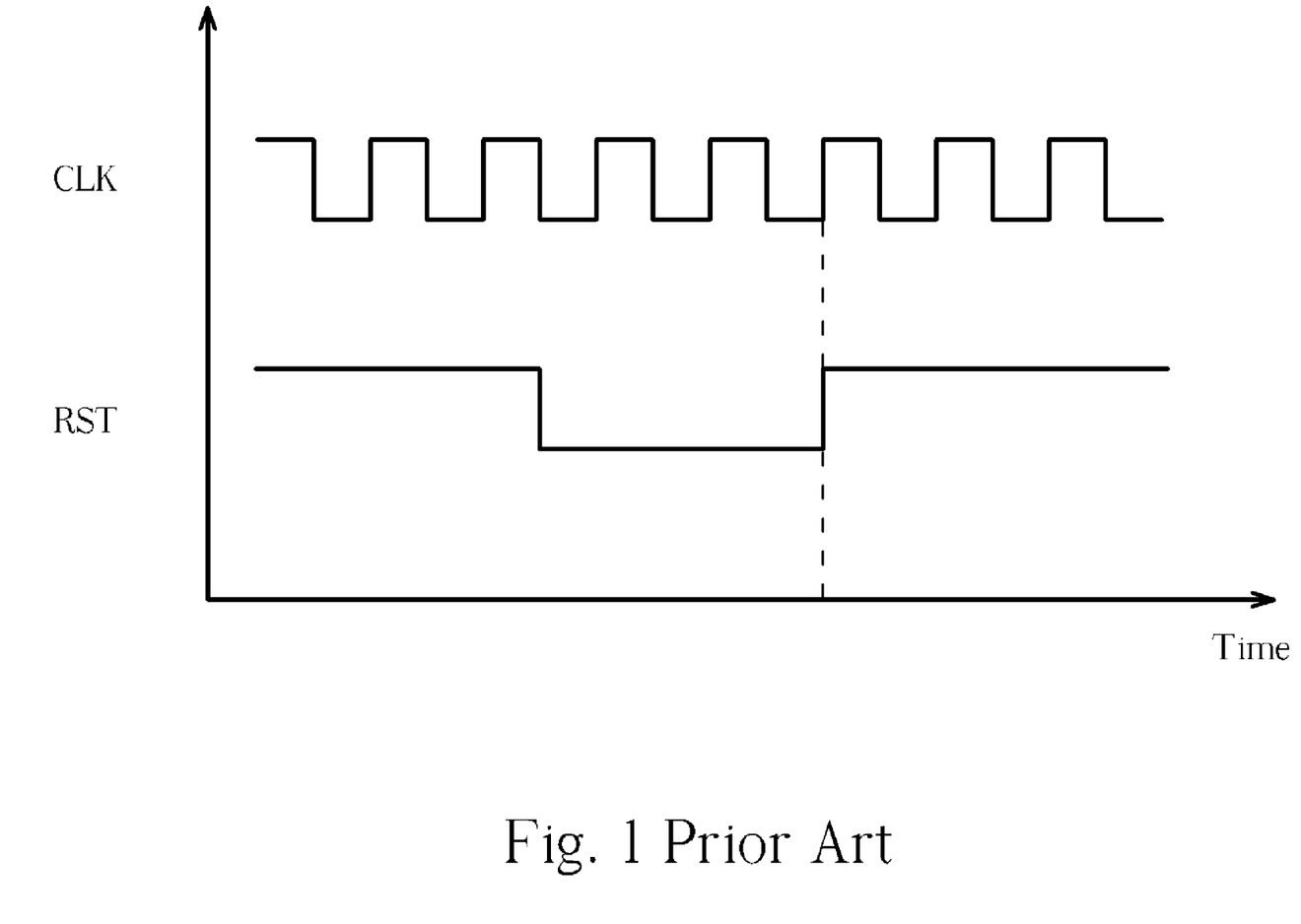
FIG. 1 is a timing diagram illustrating a conventional relationship between a clock signal and a reset signal.

Generally speaking, there are two problems existed when the asynchronous signal is transmitted to the flip-flop. One is the violation of asynchronous recover time and the other is the propagation delay of the asynchronous signal. For further illustration, please refer to FIG. 1. FIG. 1 is a diagram illustrating the relationship between a clock signal and a reset signal. As shown in FIG. 1, the reset signal RST is an asynchronous signal inputted to the flip-flop. If the reset signal RST has a transition from low level to high level (indicated by the dotted line in FIG. 1) at the rising edge or falling edge of the clock signal CLK, the error will occur at the output of flip-flop. To avoid the above-mentioned situation, it is necessary to maintain a timing difference between the time when the reset signal has a transition from low level to high level due to an end of the reset period and the time when the clock signal triggers the flip-flop. Another problem is the propagation delay of an asynchronous signal. This means that while a reset signal is transmitted to a plurality of flip-flops, some flip-flops are reset in a clock cycle, while others are reset in the next clock cycle because the reset signal arrives at the flip-flops at different times due to the propagation delay. As a result, error will occur at the output of flip-flops. The conventional solution is to make use of extra buffer(s) to balance the propagation delay. However, the number of required buffers increases as the number of flip-flops increases, thereby increasing the cost and the size of the circuit.

SUMMARY OF THE INVENTION

It is therefore one of the objectives of the present invention to provide a reset method for a digital circuit and related signal generating apparatus, to solve the above-mentioned problem.

According to one embodiment of the present invention, a reset method of a digital circuit is disclosed. The method comprises: providing a clock signal to a digital circuit; keeping the clock signal at a logic level according to a first indicating signal; generating a reset signal for resetting the digital circuit; and recovering the clock signal according to a second indicating signal.

According to another embodiment of the present invention, a signal generator apparatus for generating a clock signal and a reset signal to a digital circuit is disclosed. The generating apparatus comprises: a clock controller, for generating the clock signal to the digital circuit; and a reset signal control unit, for generating an indicating signal to the clock controller and generating the reset signal to the digital circuit. The reset signal unit generates the reset signal to the digital circuit while the clock signal is kept at a logic level.

These and other objectives of the present invention will no doubt become obvious to those of ordinary skill in the art after reading the following detailed description of the preferred embodiment that is illustrated in the various figures and drawings.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
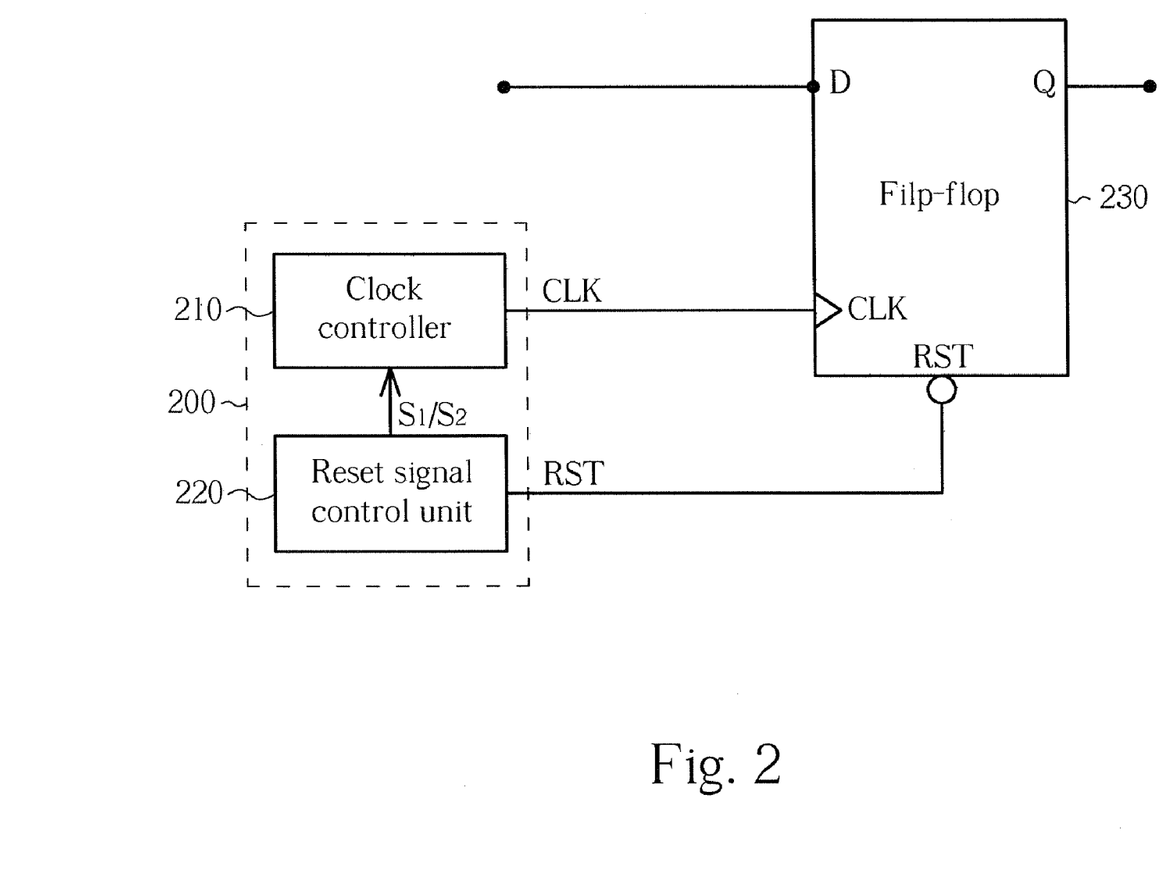
FIG. 2 is a block diagram of a signal generator applied to a flip-flop according to a first embodiment of the present invention.

Please refer to FIG. 2. FIG. 2 is a block diagram of a signal generator 200 applied to a flip-flop 230 according to a first embodiment of the present invention. The signal generator 200 comprises a clock controller 210 (e.g. a phase-lock-loop [PLL] or delay-type phase-lock-loop [DLL]) for generating a clock signal CLK to a flip-flop 230 (e.g. a delay-type flip-flop [DFF]), and a reset signal control unit 220 for generating a reset signal RST to the flip-flop 230. Additionally, the flip-flop 230 comprises an input port D for receiving data and an output port Q for outputting data. Suppose that in this embodiment the flip-flop 230 is a rising-edge-triggered flip-flop, and the reset signal RST is an asynchronous signal inputted to the flip-flop 230. When the reset signal RST is at a low voltage level (logic value "0"), the output port Q of the flip-flop 230 is set to "0". Please note that embodiments of the present invention are not limited to the type of the asynchronous signal. In this embodiment, the signal generator 200 uses the reset signal control unit 220 to generate a reset signal RST for resetting the flip-flop 230; however, in another embodiment, the signal generator 200 can use a preset signal control unit to generate a preset signal for presetting the flip-flop 230.

Figure 3:
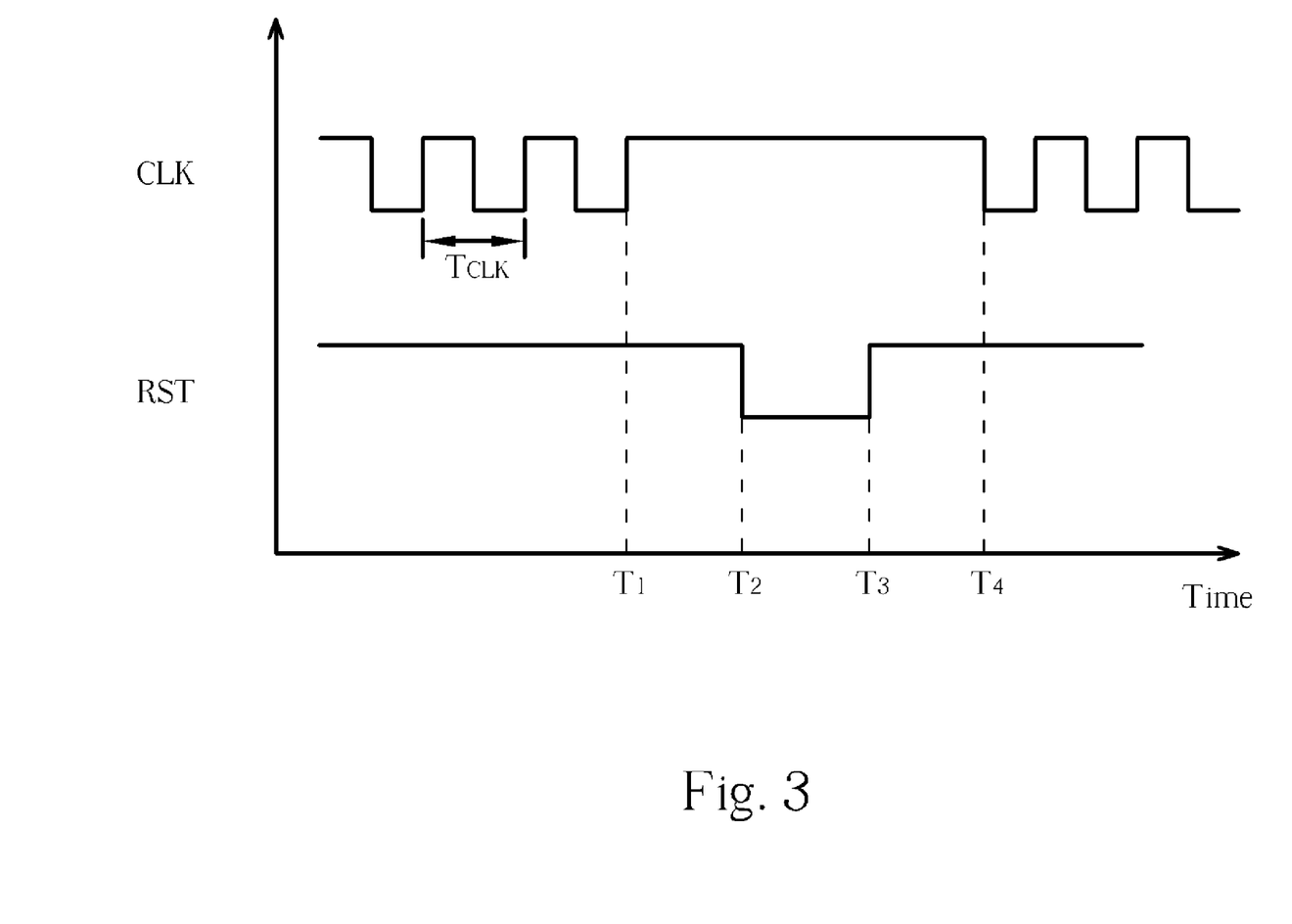
FIG. 3 is a timing diagram illustrating the relationship between a clock signal and a reset signal both generated by the signal generator shown in FIG. 2.

In order to further illustrate the embodiment of the present invention, please refer to FIG. 3. FIG. 3 is a timing diagram illustrating the relationship between a clock signal CLK and a reset signal RST both generated by the signal generator 200 shown in FIG. 2. In this embodiment of the present invention, when the flip-flop 230 is to be reset, the reset signal control unit 220 provides an indicating signal $S_1$ to the clock controller 210 for stopping (or disable) the clock signal CLK (at the time $T_1$ shown in FIG. 3), so that the clock signal CLK is kept at a logic level (logic value "1" or "0"). Next, after a predetermined period of time (e.g. at the time $T_2$ shown in FIG. 3), the reset signal control unit 220 resets the flip-flop 230 (i.e. the reset signal RST has a transition from a high voltage level to a low voltage level). At this time, the output port Q of the flip-flop 230 is reset to "0". After another predetermined period of time (e.g. at the time $T_3$ shown in FIG. 3), the reset signal control unit 220 terminates the resetting of the flip-flop 230 (i.e. the reset signal RST has a transition from a low voltage level to a high voltage level), then provides another indicating signal $S_2$ to the clock controller 210 for allowing the clock controller 210 to recover (or enable) the clock signal CLK (at the time $T_4$ shown in FIG. 3), so that the following operations of reading data and outputting data can be continued. In this embodiment of the present invention, the intervals in a range from time $T_1$ to time $T_4$ can be determined by a counter value generated by a counter. Additionally, in other embodiments, the time when the clock controller 210 resumes the generation of the clock signal CLK can be determined according to the rising edge or falling edge of the reset signal RST (e.g. the time $T_3$ shown in FIG. 3).

Figure 4:
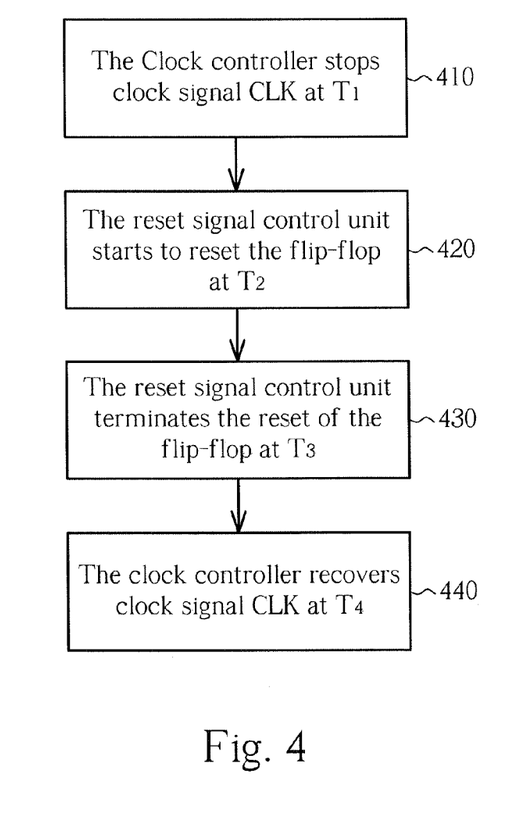
FIG. 4 is a flowchart illustrating operation of the signal generator shown in FIG. 2 that generates a reset signal to a flip-flop.

Please refer to FIG. 4. FIG. 4 is a flowchart illustrating operation of the signal generator 200 shown in FIG. 2. According to one embodiment, the method of generating a reset signal RST to the flip-flop 230 includes the following steps:

Step 410: According to a first indicating signal, the clock controller 210 stops the clock signal CLK at time $T_1$.

Step 420: The reset signal control unit 220 starts to reset the flip-flop 230 at time $T_2$.

Step 430: The reset signal control unit 220 terminates the reset operation of the flip-flop 230 at time $T_3$.

Step 440: According to a second indicating signal, the clock controller 210 recovers the clock signal CLK at time $T_4$.

Figure 5:
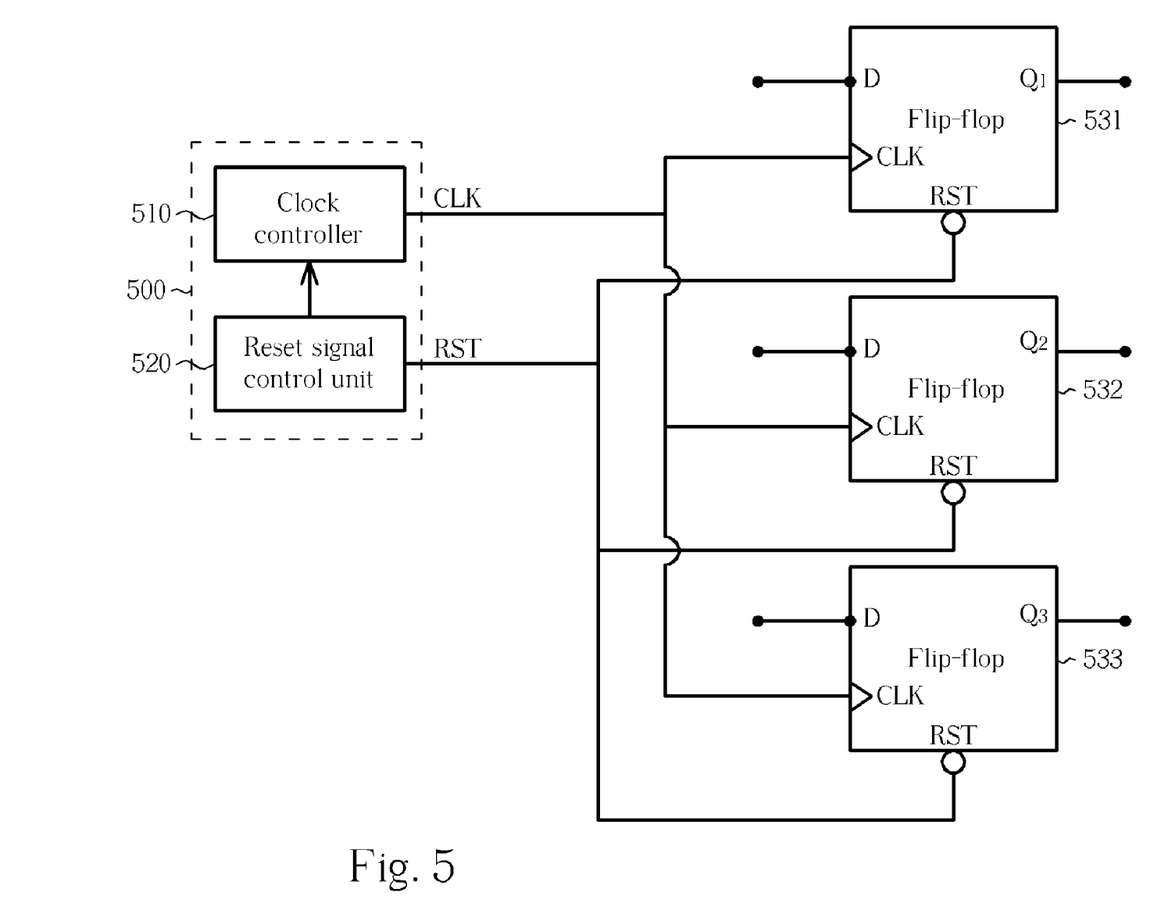
FIG. 5 is a block diagram of a signal generator applied to a plurality of flip-flops according to a second embodiment of the present invention.

The method of the present invention can also be applied to a plurality of flip-flops. Please refer to FIG. 5. FIG. 5 is a block diagram of a signal generator 500 applied to a plurality of flip-flops according to a second embodiment of the present invention. The clock controller 510 stops the clock signal CLK for a period of time prior to reset the flip-flops 531, 532 and 533, and recovers the clock signal CLK after the reset operation of the flip-flops 531, 532 and 533 has ended. In this way, the present invention does not have the problem caused by the flip-flops receiving the reset signal RST at different timing due to propagation delay.

Figure 6:
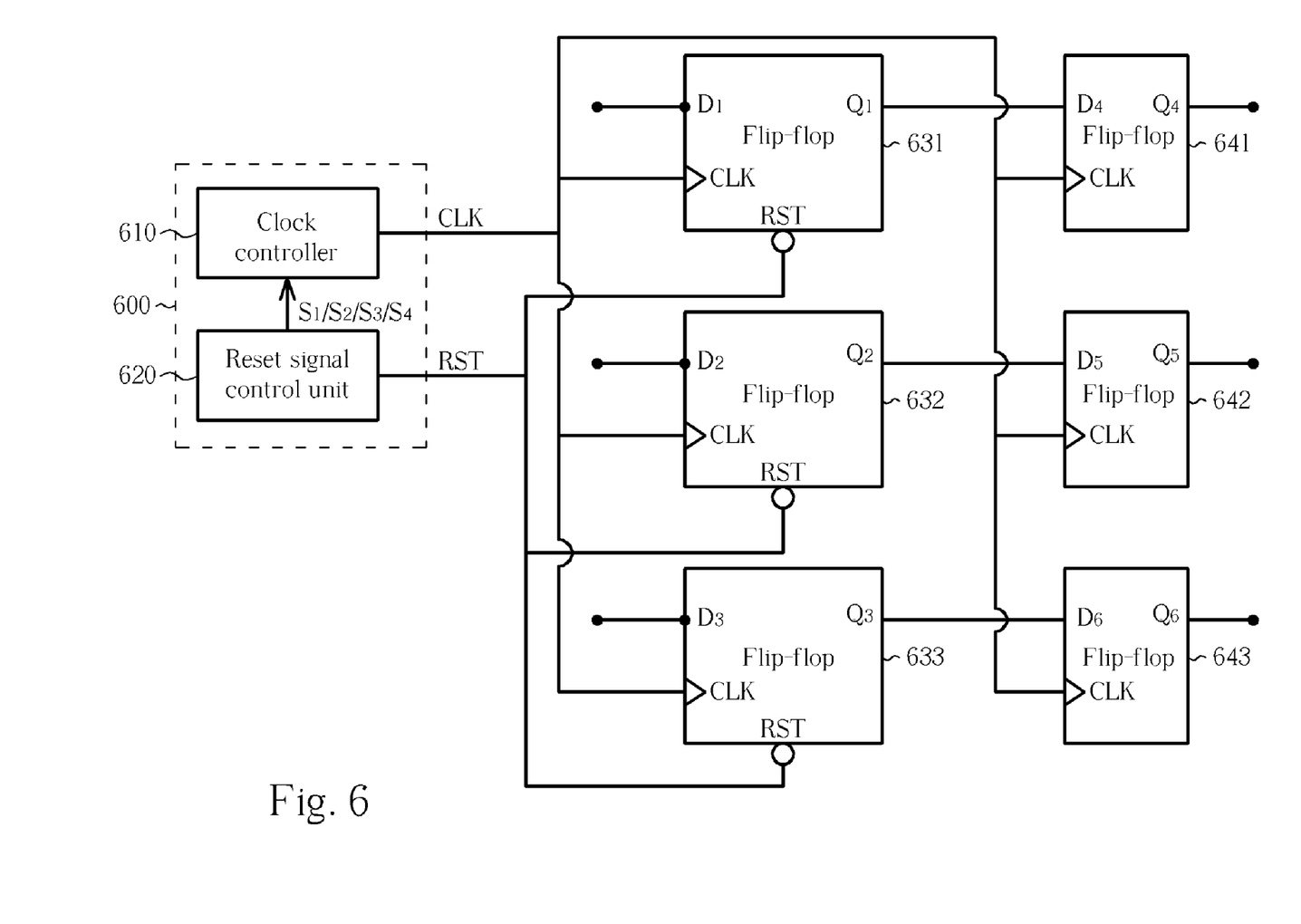
FIG. 6 is a block diagram of a signal generator applied to a plurality of flip-flops according to a third embodiment of the present invention.
Figure 7:
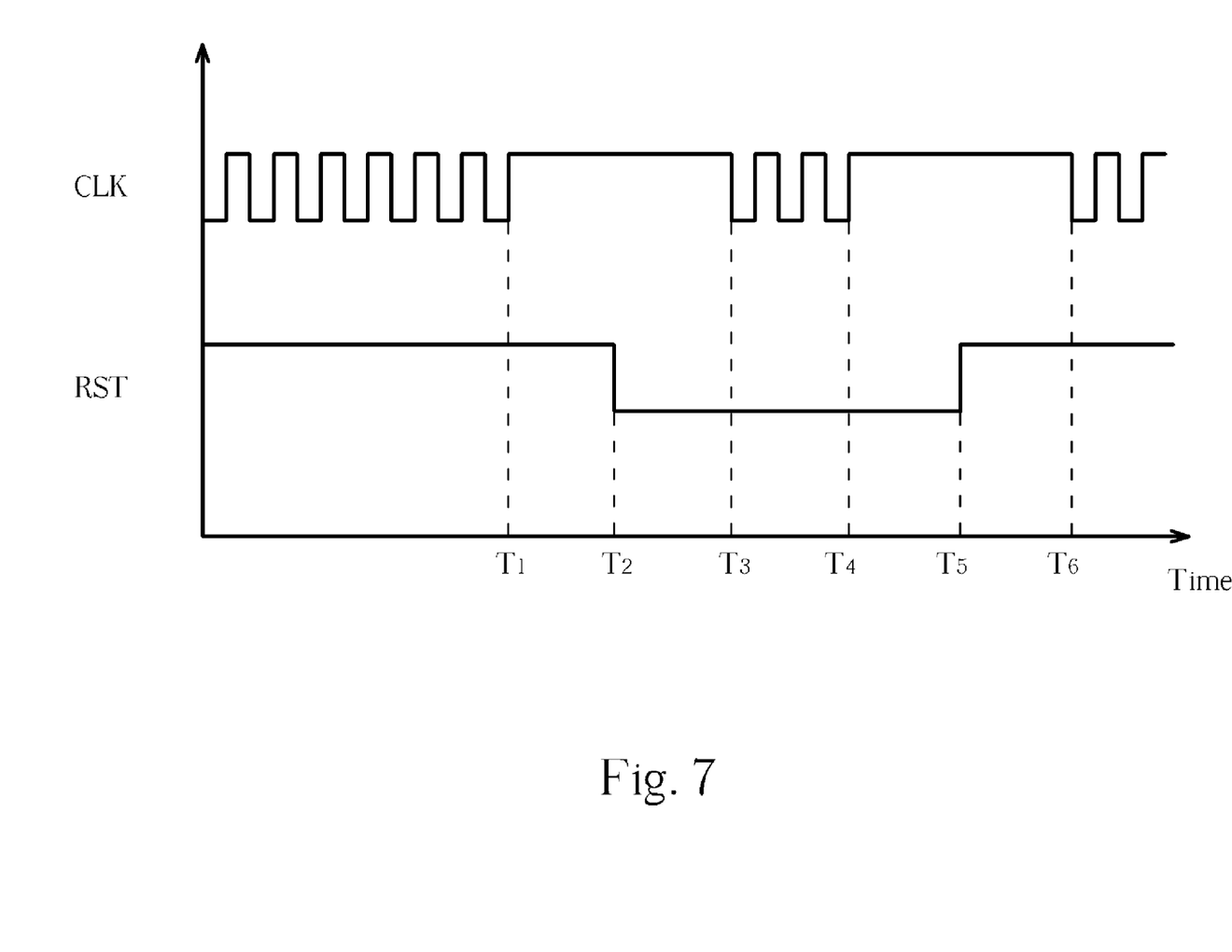
FIG. 7 is a timing diagram illustrating the relationship between a clock signal and a reset signal both generated by the signal generator shown in FIG. 6.

In addition, the method of the present invention can also be applied to synchronous reset operation. Please refer to FIG. 6 and FIG. 7. FIG. 6 is a block diagram of a signal generator 600 applied to a plurality of flip-flops according to a third embodiment of the present invention. FIG. 7 is a diagram illustrating the relationship between a clock signal CLK and a reset signal RST both generated by the signal generator 600 shown in FIG. 6. In FIG. 6, the input ports D4, D5 and D6 of the flip-flops 641, 642 and 643 are coupled to the output ports Q1, Q2 and Q3 of the flip-flops 631, 632 and 633 respectively. While the flip-flops 631, 632 and 633 are reset, the outputs of the flip-flops 631, 632 and 633, (i.e. 0's), are transmitted to the flip-flops 641, 642 and 643. Therefore, the output ports Q4, Q5 and Q6 of the flip-flops 641, 642 and 643 are reset to "0" while the flip-flops 641, 642 and 643 are triggered by edges of the clock signal CLK, achieving the synchronous reset. Please refer to FIG. 7. When the signal generator 600 of the present invention performs the reset operation, the reset signal control unit 620 provides an indicating signal $S_1$ to the clock controller 610 for stopping the clock signal CLK in advance (at the time $T_1$ shown in FIG. 7). After a predetermined period of time (at time $T_2$ shown in FIG. 7), the reset signal control unit 620 resets the flip-flops 631, 632 and 633 (i.e. the reset signal RST has a transition from a high voltage level to a low voltage level). At this time, the output ports Q1, Q2 and Q3 of the flip-flops 631, 632 and 633 are reset to "0". The clock controller 610 then recovers the clock signal CLK according to a second indicating signal $S_2$ provided by the reset signal control unit 620 (at the time $T_3$ shown in FIG. 7). After another predetermined period of time (for example, two clock cycles $T_{CLK}$), the clock controller 610 stops the clock signal CLK according to a third indicating signal $S_3$ provided by the reset signal control unit 620 (at the time $T_4$ shown in FIG. 7). Please note that the flip-flops 641, 642 and 643 will output values at the input ports D4, D5 and D6 (i.e. binary value 0's) to the output ports Q4, Q5 and Q6 due to triggering of the edge of the clock signal CLK recovered by the clock controller 610, so that the synchronous reset operation is completed. Next, after a period of time (at the time $T_5$ shown in FIG. 7), the reset signal control unit 620 terminates the reset operation (in other words, the reset signal RST has a transition from a low voltage level to a high voltage level). Then, after all of the flip-flops 631, 632, 641, 642 and 643 are completely reset, the clock controller 610 recovers the clock signal CLK according to the fourth indicating signal $S_4$ provided by the reset signal control unit 620 (at the time $T_6$ shown in FIG. 7), and the following operations of reading data and outputting data can be continued.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for resetting a clock triggering digital circuit, comprising:
   providing a clock signal for triggering the clock triggering digital circuit to the clock triggering digital circuit, wherein the clock signal transits between a first logic level and a second logic level;
   generating a reset signal to the clock triggering digital circuit;
   before an edge of the reset signal occurs, stopping the transition between the first logic level and the second logic level of the clock signal to keep the clock signal at the first logic level for the first predetermined time period according to a first indicating signal; and
   after a second predetermined time period since a second indicating signal occurs, recovering the transition between the first logic level and the second logic level of the clock signal which is stopped due to the first indicating signal;
   wherein the timing between the first and the second indication signals are determined by a counting value.

2. The method of claim 1, wherein the first and second indication signals are generated according to at least one edge of the reset signal.

3. The method of claim 1, wherein the reset signal is an asynchronous reset signal.

4. The method of claim 1, wherein the reset signal is a synchronous reset signal.

5. The method of claim 1, wherein the clock triggering digital circuit is a flip-flop.

6. The method of claim 1, wherein the clock triggering digital circuit is implemented by a plurality of flip-flops.

7. The method of claim 1, wherein the clock triggering digital circuit comprises a first flip-flop and a second flip-flop; the clock signal is outputted to the first flip-flop and the second flip-flop; and an input port of the second flip-flop is coupled to an output port of the first flip-flop.

8. The method of claim 1, wherein the clock signal is generated by a clock controller.

9. The method of claim 8, wherein the clock controller is a phase lock loop (PLL).

10. The method of claim 8, wherein the clock controller is a delay-type phase lock loop (DLL).

11. The method of claim 1, wherein the first and the second indicating signals are generated by a reset signal control unit.

12. A signal generating apparatus for generating a clock signal and a reset signal to a clock triggering digital circuit, the generating apparatus comprising:
 a clock controller, for generating the clock signal for triggering the clock triggering digital to the clock triggering digital circuit; and
 a reset signal control unit, for generating an indicating signal to the clock controller and generating the reset signal to the clock triggering digital circuit;
 wherein the clock controller keeps the clock signal at a logic level for a first predetermined time period according to a first indicating signal generated from the reset signal control unit before an edge of the reset signal occurs, and the clock controller recovers the clock signal after a second predetermined time period since a second indicating signal generated from the reset signal control unit occurs;
 wherein the reset signal control unit generates the indicating signal according to a counting value generated by a counter.

13. The signal generating apparatus of claim 12, wherein the reset signal is an asynchronous reset signal.

14. The signal generating apparatus of claim 12, wherein the clock triggering digital circuit comprises a first flip-flop and a second flip-flop, the clock signal is outputted to the first flip-flop and the second flip-flop, and an input port of the second flip-flop is coupled to an output port of the first flip-flop.

15. The signal generating apparatus of claim 14, wherein the first flip-flop is a delay-type flip-flop (DFF).

16. The signal generating apparatus of claim 12, wherein the clock controller is a phase lock loop (PLL) or a delay-type phase lock loop (DLL).

* * * * *